United States Patent [19]

Egan et al.

[11] 3,989,566

[45] Nov. 2, 1976

[54] METHOD OF HOLDING ARTICLES

[75] Inventors: James J. Egan, Allentown; Ronald I. Strohl, Walnutport; William R. Wanesky, Wescosville, all of Pa.

[73] Assignee: Western Electric Company, Inc., New York, N.Y.

[22] Filed: Nov. 20, 1972

[21] Appl. No.: 307,898

[52] U.S. Cl. .............................. 156/155; 156/230; 156/236
[51] Int. Cl.² ...................... B32B 31/14; C23F 1/00
[58] Field of Search .......... 156/155, 236, 235, 231, 156/538, 539, 541, 542, 237, 344, 305, 237; 29/589, 590, 583; 161/406

[56] References Cited
UNITED STATES PATENTS

| | | | |
|---|---|---|---|
| 3,448,510 | 6/1969 | Bippus et al. | 29/203 |
| 3,454,457 | 7/1969 | Hale et al. | 156/289 |
| 3,632,074 | 1/1972 | Wanesky | 248/346 |
| 3,663,326 | 5/1972 | Wanesky | 156/3 |
| 3,690,984 | 9/1972 | Wanesky | 156/236 |
| 3,755,048 | 8/1973 | Schubert | 156/236 |

*Primary Examiner*—Caleb Weston
*Attorney, Agent, or Firm*—R. Y. Peters

[57] ABSTRACT

An array of discrete semiconductor devices is formed by photoresist and etching techniques in a semiconductor wafer waxed to a support. The photoresist material is then removed and the devices are tested. Next, a substrate is coated with silicone resin to which the devices will adhere. The devices found from the test to have a first characteristic are transferred to the resin-coated substrate to form a new array of first characteristic semiconductor devices with the original orientation. The devices are pressed against the resin by means of a polytetrafluoroethylene screen overlaid with a stainless steel screen and trichlorethylene is flowed through the screens to the devices to remove any remanent wax. When the screens are removed the devices do not stick to the polytetrafluorethylene screen, which had been against them, but remain held on the resin coated substrate in their originally oriented array.

11 Claims, 9 Drawing Figures

METHOD OF HOLDING ARTICLES

BACKGROUND OF THE INVENTION

1. Field of the Invention

This invention relates to methods of holding articles on a substrate and, more particularly, to improved methods of holding an array of oriented semiconductor devices on a substrate during and after the removal of wax that had previously been used to cement the devices to a support.

2. Description of the Prior Art

The invention is particularly useful for the manufacture of small, fragile, devices, such as integrated circuits of the so-called beam-lead type. Examples of these beam-lead devices are disclosed in M. P. Lepselter U.S. Pat. Nos. 3,287,612 and 3,335,338. Although useful with other articles, the invention will be described particularly with respect to the beam-lead type of device which comprises a semiconductor body having integral leads extending from it as cantilever beams. These beam leads provide both the electrical and mechanical connections between the device and an electrical circuit formed on a header or a substrate having a metallized pattern. The leads are formed essentially of gold. A typical beam lead is very small, the leads being only 0.4 of a mil thick, 3 mils wide, and 9 mils long while the semiconductor body may be a square only 2 mils thick and 18 mils on a side.

In the manufacture of these devices, an array of one hundred or more bodies, each oriented in the same direction, is formed in a wafer of semiconductor material, such as silicon. The beam leads are electroplated onto the wafer so that they connect with the bodies to produce complete devices in the wafer. In order to separate the wafer into these individual beam-lead devices, while at the same time maintaining their position and orientation in the array, the wafer is secured to a support with wax with the leads of the devices embedded in the wax. The exposed surface of the wafer is masked by protective squares of photoresist material, each of which covers a device and each of which is spaced from the other. This forms a grid of interstices along which the wafer is etched to separate it into a plurality of individual beam-lead devices. These devices remain cemented to the support with the wax.

In the prior art, in order to free the devices from the support for further handling without disturbing their orientation, the devices were cleaned of the photosensitive coating and temporarily secured to an intermediate holding screen with cellulose nitrate cement. The wax was then dissolved, by means of a solvent which would not attack the cellulose nitrate cement, and the support was removed so that the devices remained on the intermediate holder still oriented but inverted. Next, the exposed portions of the devices were placed against a carrier plate which exerted an attractive force on the device. While held against the carrier plate, the cellulose nitrate cement was removed to release the devices from the intermediate holding screen and leave the devices in their original orientation on the carrier but right side up.

To simplify the processing steps, improved methods were developed. (See W. R. Wanesky U.S. Pat. No. 3,663,326.) However, it is desirable to further simplify these processing steps.

It is essential in the manufacture of the devices that the original orientation of the device be maintained for testing and bonding to electrical circuits. Also, these tiny devices must be transported, without bending the beam leads or otherwise damaging the devices, on a substrate from which they may easily be removed.

As mentioned above, in manufacturing the devices they are cemented with wax to a support. They must be subsequently transferred to a substrate to which they are not cemented. Any cement, which clings to the devices when they are transferred and which would interfere with subsequent manufacturing operations, such as bonding, must be completely removed. It is also desirable to remove this cement quickly.

The devices may be transferred from the support to a silicone resin coated substrate by means of apparatus such as that disclosed in R. I. Strohl and W. R. Wanesky, "Transfer of Integrated Circuits from Hot Wax," *technical digest*, No. 19, New York, Western Electric Co. (July 1970) pp. 45–46. The devices may also be transferred using more sophisticated apparatus such as that disclosed in J. S. Kerecz, S. Kuba and W. R. Wanesky, "Integrated Circuit Sorting Machine," *technical digest*, No. 21, New York, Western Electric Co. (January 1971) pp. 21–22. In both cases the apparatus maintains the orientation of the devices.

SUMMARY OF THE INVENTION

It is, therefore, an object of the invention to provide new and improved methods for holding articles.

It is also an object of this invention to provide new and improved methods of holding semiconductor devices in an array on a substrate during and after wax removal.

The present invention contemplates coating a substrate with an adherent first material and arraying thereon articles which have an unwanted second material clinging to them. The articles are pressed against the first material by a nonadherent third material while the second material is dissolved to remove it. When the pressing is stopped and the third material removed, the articles remain in their array on the substrate because of the adherent nature of the first material and the nonadherent nature of the third material.

BRIEF DESCRIPTION OF THE DRAWINGS

Other objects, advantages and features of the invention will be apparent from the following detailed description thereof, in which.

DETAILED DESCRIPTION

Figure 1:
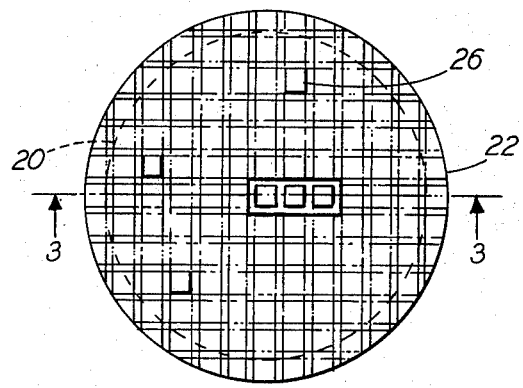
FIG. 1 is a plan view of a support and wafer after masking with photoresist material and etching the wafer into an array of individual devices.
Figure 2:
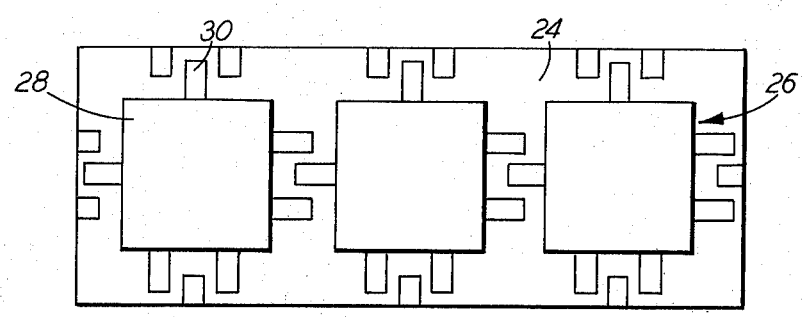
FIG. 2 is an enlarged plan view of the three devices at the center of the array of FIG. 1.

Referring to FIGS. 1 and 2, a wafer 20 is shown cemented to a support 22 with wax 24. The wafer 20 is divided into discrete devices 26, only a few of which are shown in FIG. 1, the others being indicated by phantom lines. The three devices 26 at the center of the array of FIG. 1 are shown enlarged in FIG. 2.

Figure 3:
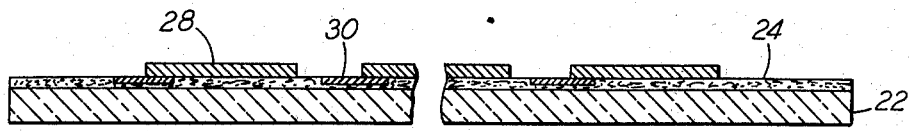
FIG. 3 is a partial cross section along line 3—3 of FIG. 1.

The wafer 20 has been separated into individual devices 26 each of which has a body 28 and a plurality of beam leads 30 extending from the body 28. The separation is performed by photolithographic methods well known in the art, e.g., Berry, Hall and Harris, *Thin Film Technology*. New York: D. VanNostrand Co. (1968) pp. 419–466, and W. R. Wanesky U.S. Pat. No. 3,663,326. The photoresist material used in carrying out the methods is removed and this leaves a support 22 to which an array of devices is cemented with the upper surface of their leads 30 exposed, as shown in FIG. 3.

The support 22 may be any suitable material such as a ceramic, glass or sapphire disc and the wax 24 may be of the type sold by the Biwax Corporation under the trade designation B-7050, which is filtered to removed all particles over 0.2 of a mil in diameter.

The devices 26 may be tested using any suitable techniques to determine their characteristics by contacting the exposed upper surface of the beam leads 30. Those having a desired first characteristic may be identified while all those not having that characteristic may be thought of as having a second characteristic and left unidentified.

It is advantageous to have an array of devices 26 in which all of the devices 26 are alike and possess the desired first characteristic. Consequently, devices 26 having the first characteristic are removed from enough supports 22 to permit forming a new array of all first-characteristic devices 26.

Figure 4:
FIG. 4 is a cross section of a substrate coated with silicone resin.

Referring now to FIG. 4, a coating 34 is applied to a substrate 36. The coating 34 is an adherent material, such as silicone resin, 10 to 80 millionths of an inch thick, which is sold by Dow Corning under the trade designation "Junction Coating No. R-6103." This material is not only one which will adhere to the substrate 36 but is one to which the devices 26 will adhere. Consequently, the coating 34 will retain the devices 26 in the position in which they are placed thereon. The coating 34 may be applied by methods well known in the art, e.g., spinning or spraying, and the substrate 36 may be any suitable material such as ceramic, glass or sapphire.

Figure 5:
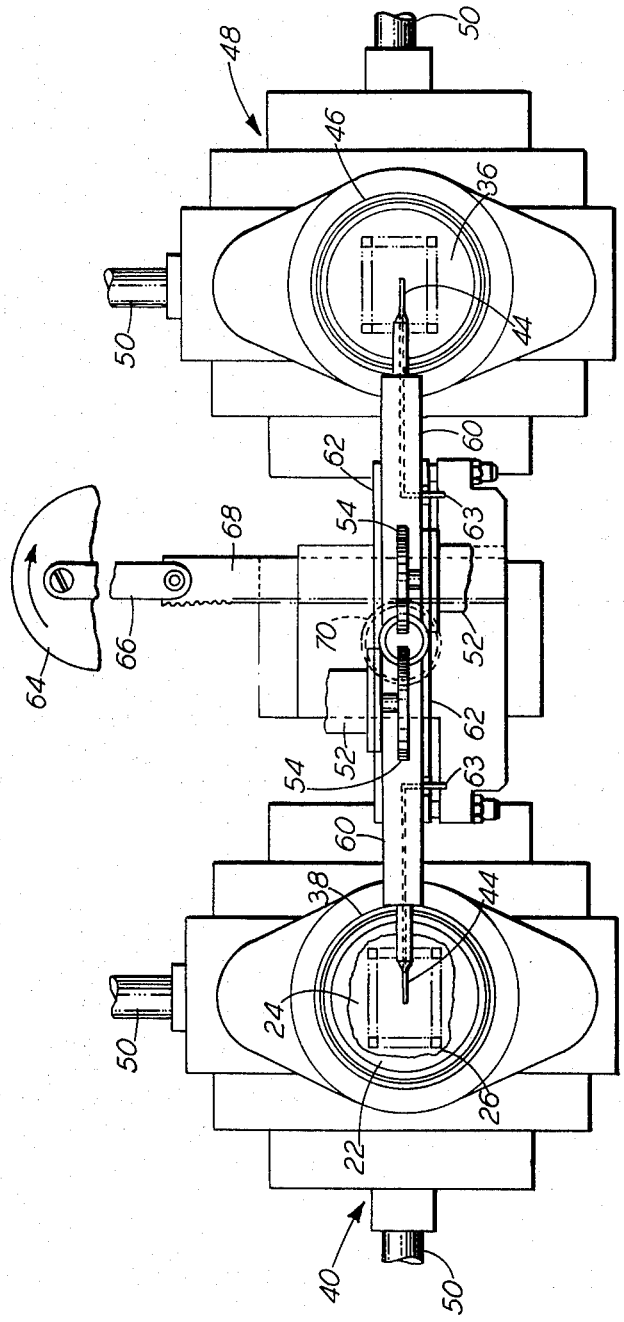
FIG. 5 is a plan view of an apparatus for heating the support and substrate and transferring devices from the support to the substrate.
Figure 6:
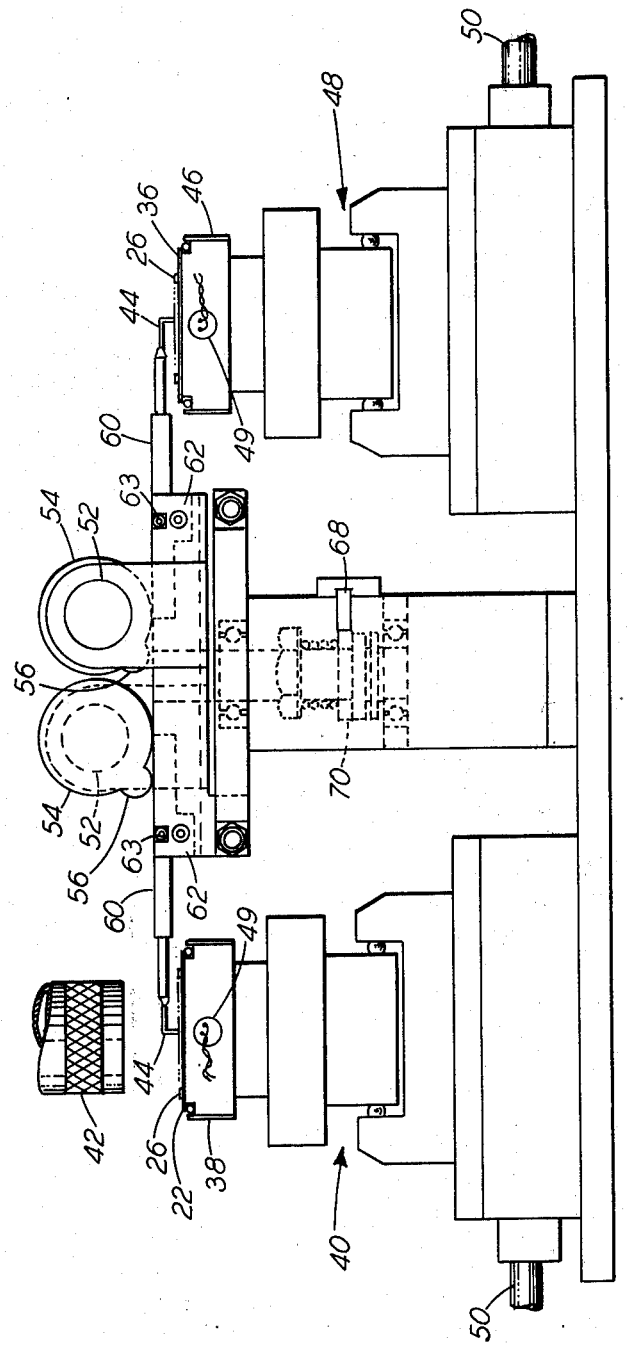
FIG. 6 is an elevation of the apparatus of FIG. 5.

The devices 26 may be transferred from the wax 24 on the support 22 to the coating 34 on the substrate 36 by facilities known in the art, e.g., the apparatus of FIGS. 5 and 6. Referring to these figures, which are plan and elevation respectively, the support 22 is placed on an input positioning table 38 which is mounted on an input fixture 40. The table 38 is rotated and aligned using a microscope 42, of which only the objective is shown, and moved in the X and Y directions to set the starting position. This is the position where the first device 26 in the array on the support 22 is aligned with the pickup tip of the one above it of a pair of vacuum needles 44.

One substrate 36, having the coating 34, is placed on an output table 46 which is mounted on an output fixture 48. The table 46 is adjusted to a suitable starting point for forming an array of first-characteristic devices 26 on the substrate 36. Both of the fixtures 40 and 48 are heated by cartridge type heaters 49 to melt the wax 24; the former so that the devices 26 may be removed from the wax 24, and the latter so that the remanents of hard wax 34 clinging to the bottom of the leads 30 will melt and not cause the leads to bend upward when the devices are put down on the coating 34.

The first device 26 on the support 22, identified as having the desired first characteristic, is moved into position beneath the pickup tip of the vacuum needle 44 above the support 22 by actuating stepping motors (not shown) which drive shafts 50. Then, cam motors 52, and therefore cams 54, are revolved one revolution under control of suitable circuitry to lower and raise the vacuum needles 44. The cams 54 are stopped with their lobes 56 depressing the inner ends of arms 60, which are pivoted in a yoke 62, so that the tip of needles 44 are elevated. A device 26, in this case one having a first-characteristic, is picked up and held in the elevated position by applying a vacuum through flexible connections (not shown) to tubes 63 when the needle 44 is in its lowermost position over the support 22.

Next, a single revolution clutch (not shown) is actuated to rotate a crank disc 64 through 180°. This, in turn, rotates the yoke 62 clockwise 180° by means of a link 66, a rack 68 and a pinion 70. As a result, the first-characteristic device 26 is now positioned over the substrate 36 and the tip of an empty vacuum needle 44 is positioned over the support 22 ready to pick up the next device 26.

The next first-characteristic device 26 on the support 22 is moved under the top of the vacuum needle 44 by means of the input fixture 40, the shafts 50 and the stepping motors. When this has occurred, the output table 46 is moved one increment along the first row of the array to be formed on the substrate 36 by one of the output fixture 48 stepping motors (not shown). This positions the substrate 36 to receive the device 26.

The cams 54 rotate again to lower and raise the tips of vacuum needles 44. When the tip of the vacuum needle 44 over the substrate 36 is in its lowermost position, the vacuum is removed so that the device 26 remains deposited on and adhered to the coating 34 after the tip is raised. The vacuum, therefore, is applied to the tip of each vacuum needle 44 from the time it reaches its lowermost position over the support 22 until it reaches its lowermost position over the substrate 36.

Next, the single revolution clutch is again actuated to revolve the disc 64 another 180° and the cycle repeated. But this time the the yoke 62 rotates counterclockwise 180° because the rack 68 moves in the reversed direction. Therefore, the yoke 62 revolves clockwise on alternate cycles and counterclockwise on the in-between cycles. On each cycle one device 26 is picked up from the support 22 and one deposited on the substrate 36.

When the end of a row is reached, the output fixture 48 is shifted one increment normal to the row just traversed and the next row is started. When all first-characteristic devices 26 are transferred from one support 22, another support 22 is substituted for it, aligned as previously described, and the first-characteristic devices 26 transferred from it. The procedure is repeated until a complete array of first-characteristic devices 26 having their original orientation is formed on the substrate 36.

Figure 7:
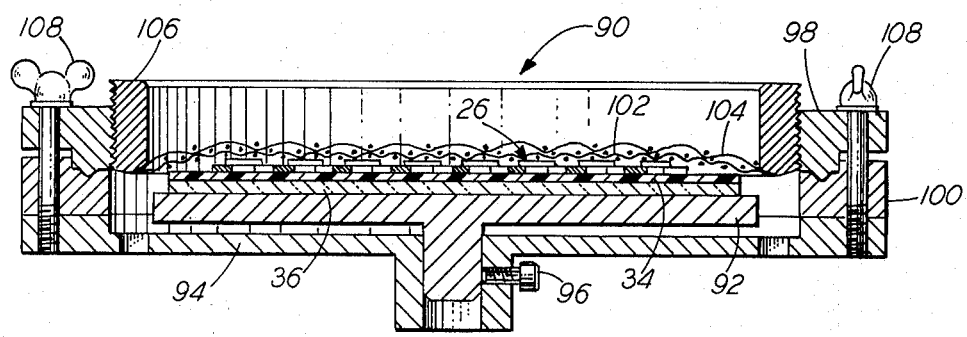
FIG. 7 is a cross section of a fixture for pressing the devices against the resin coating on the substrate.
Figure 9:
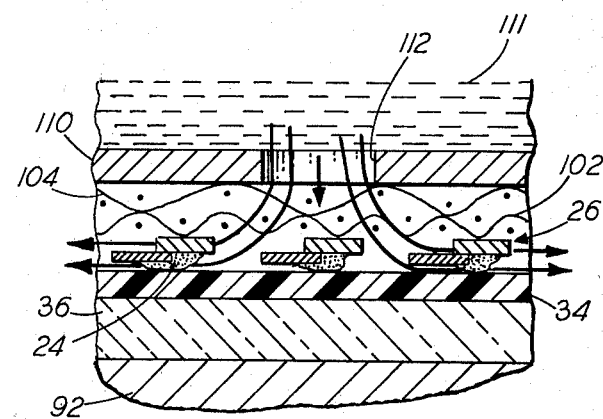
FIG. 9 is an enlarged view of the center portion of FIG. 8 showing the flow of the solvent through a mesh and screen past the devices.

When the devices 26 are removed from the wax 24, some of the wax 24 adheres to them, refer to FIG. 9, and must be removed. A fixture 90 for pressing the devices 26 against the coating 34 while removing the wax 24 is shown in FIG. 7. The fixture 90 includes a platform 92 which is adjustable up or down with respect to a base 94 and is locked in position by means of a lock screw 96. A polytetrafluoroethylene (Teflon) screen 102 is clamped between upper and lower clamping rings 98 and 100, respectively. Ideally, the screen 102 is backed up by a mesh 104 although this is not essential. The screen 102 and mesh 104 are stretched tightly across the clamping rings 98 and 100 by a threaded tensioning ring 106 when it is screwed down against them. The screen 102 and mesh 104 are drawn against the platform 92, or objects thereon, by clamping screws 108 which are threaded into the base 94.

The screen 102 may be made of material such as 0.004 inch diameter Teflon monofilament woven to a 95 × 95 mesh. The mesh 104 may be made of a material such as 0.0045 of an inch diameter stainless steel wire woven into a 60 × 60 mesh wire cloth.

The array of devices 26 is pressed against the coating 34 by placing the substrate 36 on the platform 92 of the fixture 90 and adjusting the platform to a height such that, when the clamping rings 98 and 100 are drawn down by the screws 108, the screen 102 and mesh 104 will press the devices against the coating 34. This adjustment is made sufficient to compress and flatten the convolutions of the screen 102 slightly. The convolutions tend to return to their true shape and thus will maintain some force against the devices 26 to compensate for the thickness of the wax 24 removed. The mesh 104 adds support to the screen 102 and its use in conjunction therewith is preferred; but the Teflon screen 102 may be used alone.

Figure 8:
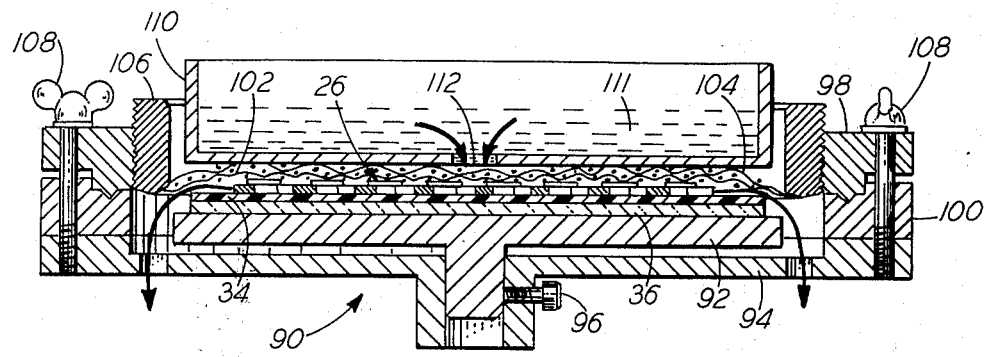
FIG. 8 is the cross section of FIG. 7 with a container added for directing the flow of trichlorethylene solvent.

Referring now to FIG. 8, a container 110, having an aperture 112 centrally located in its bottom, is placed over the screen 102 and mesh 104 and filled with a solvent 111 for the wax 24, e.g., trichlorethylene.

The solvent 111 flows through the aperture 112, refer to FIG. 9, through the mesh 104 and screen 102, and radially outward along the coating 34 to dissolve the wax 24. Thus, the container 110 with its aperture 112 directs the flow of the solvent 111 through the screen 102 and mesh 104 and then outward beneath them.

When the solvent 111 is condensed and allowed to drip onto the mesh 104, as in prior art methods, much of the solvent 111 tends to flow out over the top of mesh 104 and bipass the wax because the mesh 104 is very fine. This reduces the efficiency of the process because a portion of the solvent 111 does not dissolve any of the wax 24. However, since the container 110 directs the flow of solvent 111 beneath the mesh 104 and screen 102, most of the solvent of the subject invention is available for dissolving the wax. Thus, the present method is more efficient and removes the wax 24 faster than the prior methods so that it is a considerable improvement over them.

Once the wax 24 has been removed from the devices 26, the substrate 36 is removed from the fixture 90 by: removing the clamp screws 108; lifting off the clamp rings 98 and 100 with the screen 102 and mesh 104 as an assembly; and lifting out the substrate. The devices 26 do not tend to stick to the Teflon screen 102 but instead adhere to the coating 34. There is sufficient adhesion between the devices 26 and the coating 34 to permit the devices 26 to be transported to other manufacturing operations, such as bonding, in their precise array without being disturbed.

Although the invention has been described with regard to beam-lead semiconductor devices, the principle may be applied to other articles.

What is claimed is:

1. A method of holding an article on a substrate, which comprises the steps of:
   a. selecting an article, having a desired characteristic from a group of articles;
   b. placing the selected article on a coating of silicone resin on the substrate;
   c. pressing the article against the silicone resin with a plastic screen;
   d. dissolving unwanted material, while pressing the article against the silicone resin, to remove such material from the article; and
   e. removing the plastic screen to leave the article held on the substrate by the silicone resin for further processing.

2. A method of holding a plurality of articles on a substrate, which comprises the steps of:
   a. applying a coating of silicone resin to a substrate;
   b. selecting articles which may have unwanted material clinging thereto and which have a desired characteristic from a group of articles;
   c. placing the selected articles on the silicone resin to form a complete array of articles, all of which have the desired characteristic;
   d. pressing the articles against the silicone resin with a plastic screen;
   e. flowing a removal agent for the unwanted material on the array of articles while pressing them against the silicone resin to remove the unwanted material; and
   f. removing the plastic screen to leave the articles undisturbed and adhered to the substrate by the silicone resin in an array of like-characteristic articles for further processing.

3. A method of holding an array of articles on a substrate for removal of unwanted material, which comprises the steps of:
   a. coating the substrate with silicone resin;
   b. selecting articles from a group of articles;
   c. arranging the selected articles in a complete array of such articles on the silicone resin;
   d. covering the array of articles with a plastic screen;
   e. forcing the array of articles against the silicone resin by means of the plastic screen;
   f. applying a solvent to remove unwanted material from the article; and
   g. removing the plastic screen to leave the array adhered to the silicone resin on the substrate for further processing.

4. The method as recited in claim 3, wherein the selecting and arranging of articles, comprises the steps of:
   a. removing the first-characteristic articles from a support to which the articles having either a first characteristic or a second characteristic have been attached with wax; and
   b. placing the first-characteristic articles in an array on the silicone resin on the substrate, thereby providing a substrate with all first-characteristic articles.

5. The method as recited in claim 3, wherein the plastic screen is a polytetrafluoroethylene screen.

6. The method as recited in claim 5 wherein the plastic screen is overlaid with a stainless steel mesh.

7. The method as recited in claim 6, wherein the unwanted material is wax and the step of dissolving the material comprises:
   a. placing a container, having a central aperture in its bottom, against the stainless steel mesh; and
   b. flowing trichlorethylene from the container through the aperture, through the stainless steel mesh, through the polytetrafluoroethylene screen and then radially outward past the articles to remove any residual unwanted material.

8. A method for holding an array of oriented semiconductor devices on a substrate, the devices having either a first or a second characteristic and having been previously attached with wax in an array to a support, which comprises the steps of:
   a. coating the substrate with silicone resin to which the devices will adhere;
   b. heating the support to soften the wax;
   c. selecting those devices of like characteristics for transfer to the substrate;
   d. transferring the selected devices from the array on the support to form another complete array of all like-characteristic devices which adhere to the silicone resin on the substrate;
   e. pressing the devices against the silicone resin with a plastic screen; and
   f. removing the screen to leave the devices held to the substrate by the silicone resin in an undisturbed array.

9. A method as recited in claim 8, wherein the pressing step is followed by the step which comprises: dissolving residual wax, carried with the devices from the support, in trichlorethylene.

10. A method of holding an array of oriented semiconductor devices on a substrate, the devices having either a first or second characteristic and having been previously attached with wax to a support, which comprises the steps of:
   a. coating the substrate with a silicone resin;
   b. heating the support to soften the wax;
   c. selecting devices having like characteristics;
   d. transferring the devices having like characteristics from the support to the substrate to form a complete array of like-characteristic devices on the substrate, the devices being held to the substrate by the silicone resin;
   e. pressing the devices against the resin with a polytetrafluorethylene screen overlaid with a wire mesh that is coarser than the polytetrafluoroethylene screen;
   f. placing a container, having a central aperture in its bottom, against the mesh;
   g. filling the container with trichlorethylene;
   h. flowing the trichlorethylene through the aperture, mesh, and screen radially outward along the resin coating to dissolve any residual wax transferred with devices from the support to the substrate; and
   i. removing the container, screen and mesh to leave the devices held to the substrate by adherence to the resin coating.

11. A method is recited in claim 10, wherein the transferring step includes heating the substrate.

* * * * *